United States Patent
Hong et al.

(10) Patent No.: US 11,983,953 B2
(45) Date of Patent: May 14, 2024

(54) IN-DISPLAY FINGERPRINT SENSING SYSTEM

(71) Applicant: Obsidian Sensors, Inc., San Diego, CA (US)

(72) Inventors: John Hong, San Diego, CA (US); Bing Wen, San Diego, CA (US)

(73) Assignee: Obsidian Sensors, Inc., San Diego, CA (US)

( * ) Notice: Subject to any disclaimer, the term of this patent is extended or adjusted under 35 U.S.C. 154(b) by 96 days.

(21) Appl. No.: 17/763,591

(22) PCT Filed: Sep. 23, 2020

(86) PCT No.: PCT/US2020/052303
§ 371 (c)(1),
(2) Date: Mar. 24, 2022

(87) PCT Pub. No.: WO2021/061839
PCT Pub. Date: Apr. 1, 2021

(65) Prior Publication Data
US 2023/0343130 A1    Oct. 26, 2023

Related U.S. Application Data

(60) Provisional application No. 62/905,213, filed on Sep. 24, 2019.

(51) Int. Cl.
*G06F 3/044*    (2006.01)
*G06F 3/041*    (2006.01)
*G06V 40/13*    (2022.01)

(52) U.S. Cl.
CPC .......... *G06V 40/1318* (2022.01); *G06F 3/041* (2013.01)

(58) Field of Classification Search
CPC .......... G06V 40/1318; G06V 40/1306; H10K 59/121; G06F 3/041; G06F 3/04883
USPC ........................................................ 345/173
See application file for complete search history.

(56) References Cited

U.S. PATENT DOCUMENTS

| | | | |
|---|---|---|---|
| 2009/0237363 A1* | 9/2009 | Levy | G06F 3/04883 345/173 |
| 2018/0151656 A1* | 5/2018 | Choo | G06V 40/1318 |
| 2018/0173343 A1* | 6/2018 | Pi | G06F 3/041 |
| 2018/0357462 A1 | 12/2018 | Mackey et al. | |
| 2019/0012512 A1 | 1/2019 | He et al. | |

(Continued)

FOREIGN PATENT DOCUMENTS

| | | |
|---|---|---|
| CN | 107580709 A | 1/2018 |
| CN | 108109582 A | 6/2018 |

OTHER PUBLICATIONS

Office Action received in Taiwanese Application No. 109133153, dated Jan. 5, 2024, 13 pages.

*Primary Examiner* — Abdul-Samad A Adediran
(74) *Attorney, Agent, or Firm* — Procopio, Cory, Hargreaves & Savitch LLP

(57) ABSTRACT

Methods and systems for sensing a user interaction (e.g., a fingerprint) with a display of an electronic device are disclosed. In some embodiments, the method includes illuminating, with a light source, a position of a user interaction on the display. In some embodiments, the method includes detecting, with a detector, a backscattered light from the position. In some embodiments, the light source and the detector are located on a same layer of the display.

14 Claims, 5 Drawing Sheets

(56) References Cited

U.S. PATENT DOCUMENTS

2019/0310724 A1* 10/2019 Yeke Yazdandoost ...................... H10K 59/121
2019/0324640 A1* 10/2019 Park ................... G06V 40/1306

* cited by examiner

IN-DISPLAY FINGERPRINT SENSING SYSTEM

CROSS REFERENCE TO RELATED APPLICATIONS

This application is a national stage application under 35 U.S.C. § 371 of International Application No. PCT/US2020/052303, filed internationally on Sep. 23, 2020, which claims the benefit of U.S. Provisional Application No. 62/905,213 filed on Sep. 24, 2019, the entire disclosures of which are herein incorporated by reference in their entirety.

FIELD

This disclosure generally relates to sensors. More specifically, this disclosure relates to display fingerprint sensors.

BACKGROUND

Authentication of mobile users by scanning fingerprints is an important function in an increasingly security conscious market. The industry has moved on from discrete fingerprint sensors that use electrostatic sensors, to those that can be incorporated into the display area without taking up additional display area on, e.g., a mobile phone, tablet or other mobile devices. Traditional systems may suffer from a number of problems: 1) physically discrete modules must be added to the display stack which lead to two sub problems— a) added module cost to the overall device, b) the fingerprint can be scanned only in particular areas that are predefined on the display glass, 2) the systems add thickness to the display stack, 3) flexible substrates may interfere with the acoustic wave phenomenology of ultrasonics.

SUMMARY

Methods and systems for sensing a user interaction (e.g., a fingerprint) with a display of an electronic device are disclosed. In some embodiments, the method includes illuminating, with a light source, a position of a user interaction on the display. In some embodiments, the method includes detecting, with a detector, a backscattered light from the position. In some embodiments, the light source and the detector are located on a same layer of the display.

In some embodiments, a method includes: at an electronic device including a display, the display including a light source and a detector, wherein the electronic device displays content on the display by illuminating the display with the light source: detecting, with the display, a user interaction with the display; determining a position of the user interaction on the display; in response to determining the position of the user interaction: illuminating, with the light source, the position on the display; detecting, with the detector, a backscattered light from the position; processing, based on the detected backscattered light, an image of the user interaction; and identifying, based on the image, a fingerprint of the user interaction.

In some embodiments, the method further includes: illuminating, with a second light source of the display, a second position on the display; and detecting, with a second detector of the display, a second backscattered light from the second position. Processing the image of the user interaction is based on the detected second backscattered light.

In some embodiments, the method further includes detecting, with a second detector of the display, a second backscattered light from the position. Processing the image of the user interaction is further based on the detected second backscattered light.

In some embodiments, the method further includes: illuminating, with a second light source of the display, a second position on the display; and detecting, with third and fourth detectors of the display, third and fourth backscattered lights from the second position, respectively. Processing the image of the user interaction is based on the third and fourth backscattered lights.

In some embodiments, the electronic device includes a readout circuit and a multiplexer including a first column input and a second column input, and the multiplexer is electrically coupled to the readout circuit. The method further includes receiving, at the first column input, a first signal associated with the detected first backscattered light; and receiving, at the second column input, a second signal associated with a detected second backscattered light.

In some embodiments, the method further includes processing, based on the detected second backscattered light, a second image of the user interaction. The first signal is associated with a first frame of the image; the second signal is associated with a second frame of the image; and processing the image of the user interaction includes combining the first frame and the second frame.

In some embodiments, the method further includes receiving, at the first column input, a third signal associated with a detected third backscattered light, wherein a time between the receiving of the first signal and the receiving of the third signal is less than 67 mS.

In some embodiments, processing the image of the user interaction includes scaling an area of the image by one-fourth.

In some embodiments, the light source and the detector are located on a same layer of the display.

In some embodiments, the display includes a plurality of light sources and detectors, the light sources and the detectors have same pitch widths, the plurality of light sources include the light source, the plurality of detectors include the detector, and the light source is located at a half pitch width from the detector.

In some embodiments, the method further includes: determining a second position of the user interaction on the display; in response to determining the second position of the user interaction: illuminating, with a second light source of the display, the second position on the display; detecting, with a second detector of the display, a second backscattered light from the second position; processing, based on the detected second backscattered light, the image of the user interaction; and identifying, based on the image, a second fingerprint of the user interaction. The first position corresponds to the first fingerprint, and the second position corresponds to the second fingerprint.

In some embodiments, the light source is located within a distance less than three times a thickness of a cover glass of the display from the detector.

In some embodiments, the display includes a plurality of light sources, the detector is located within a range of the backscattered light, the plurality of light sources include the first light source and a second light source, the second light source located within the range of the backscattered light, and the method further includes: in response to illuminating the position on the display with the first light source, forgoing illuminating with the second light source.

In some embodiments, a non-transitory computer readable storage medium stores one or more programs, and the one or more programs includes instructions, which when executed by an electronic device with one or more processors and memory, cause the device to perform any of the above methods.

In some embodiments, an electronic device includes: a processor; a memory; a display including a light source and a detector, wherein the electronic device displays content on the display by illuminating the display with the light source; and a program stored in the memory, configured to be executed by the processor, and including instructions for performing any of the above methods.

DETAILED DESCRIPTION OF EXEMPLARY EMBODIMENTS

In the following description of embodiments, reference is made to the accompanying drawings which form a part hereof, and in which it is shown by way of illustration specific embodiments which can be practiced. It is to be understood that other embodiments can be used and structural changes can be made without departing from the scope of the disclosed embodiments.

Figure 1:
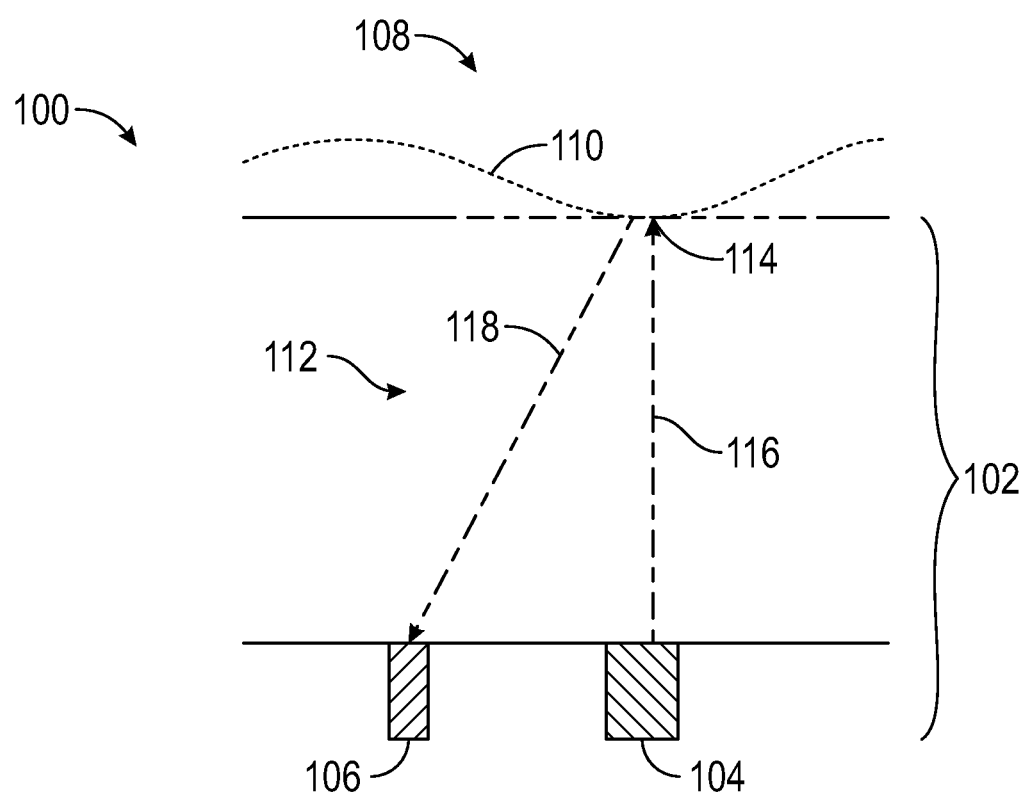
FIG. 1 illustrates an exemplary sensor system, according to embodiments of the disclosure.

FIG. 1 illustrates an exemplary sensor system 100, according to embodiments of the disclosure. In some embodiments, the sensor system 100 is configured to sense a fingerprint of finger 108. In some embodiments, the sensor system 100 includes a display 102, and the display 102 includes a light source 104, and a detector 106. In some embodiments, content (e.g., affordances on a graphical user interface (GUI) or media content on a mobile device, a GUI or media content on a display device) is presented on the display 102 by illuminating the light source 104.

In some embodiments, the light source 104 is an OLED (e.g., a green OLED of a display, a red OLED of a display, a blue OLED of a display), and the detector 106 is a photodiode. For example, the photodiode is made with amorphous silicon as a detection material, and the p-type (e.g., boron doped), intrinsic part, and n-type (e.g., phosphorus doped) can be formed by deposition to implement a PIN structure for efficient detection (e.g., an entire area of the diode is used for detection). Anti-reflective coatings may be applied on top of the photodiode to minimize reflection to a viewer.

In some embodiments, the display 102 includes a cover glass 112. In some embodiments, the cover glass 112 is a substrate for the light source, detector, and traces electrically coupled to the light source and the detector. In some embodiments, the traces are electrically coupled to a readout circuit (e.g., readout circuit 404). In some embodiments, the cover glass 112 has a thickness of 0.5 mm. In some embodiments, the cover glass 112 is an area of the display of the electronic device. For example, the area of the cover glass 112 has a diagonal dimension of 4 inches-15 inches.

Although the sensor system 100 is illustrated and described as having one light source and one detector, it is understood that the illustration and descriptions are merely exemplary. Any number of light sources and detectors may be included in the disclosed sensor system. Although the sensor system 100 is illustrated along one direction, it is understood that the sensor system may span similarly in a different dimension (e.g., in a direction in and out of the page).

In some embodiments, the light source 104 and the detector 106 are located on a same layer of the display 102 (e.g., the light source and detector reside on a same semiconductor plane, the light source and the detector are manufactured directly on to a same substrate, the light source and the detector are manufactured in a same deposition layer of a semiconductor manufacturing process). By locating the light source 104 and the detector 106 on a same layer of the display 102, the thickness and cost of the electronic device including the sensor system may be advantageously reduced. For example, as described in more detail herein, by locating a light source and a detector on a same layer of the display to sense a fingerprint (e.g., by manufacturing the detecting photodiodes with the display OLEDs together), the display may function as a fingerprint sensor (e.g., using a same light source to present content on the electronic device and illuminate a position of a user interaction). A discrete fingerprint sensor (e.g., a discrete physical fingerprint sensing module, an ultrasonic fingerprint sensor) may not be needed to sense a fingerprint. Therefore, there would be no added thickness and cost from the discrete fingerprint sensor on the electronic device to sense a fingerprint. As another example, by using the display to function as a fingerprint sensor, the entire area of the display may be used to sense for the fingerprint (e.g., the fingerprint may be identified anywhere on the display), compared to a limited area when a discrete fingerprint sensor is used instead. As yet another example, by using the display to function as a fingerprint sensor, more than one fingerprint may be sensed, compared to a discrete fingerprint sensor configured to sense one fingerprint (e.g., due to cost and/or size limitations, the discrete sensor may have limited coverage area). Furthermore, the sensor system 100 advantageously may not require an optical imaging device such as collimators, lenses or aligned pinholes to identify a user interaction, keeping cost of the electronic device low and not adding to an overall thickness of a display.

In some embodiments, FIG. 1 illustrates a portion of a sensor system. For example, light source 104 is included in a plurality of light sources of the sensor system (e.g., other light sources may be included between the light source 104 and the detector 106, other light sources may be included in an unillustrated part of the sensor system), and the detector 106 is included in a plurality of detectors of the sensor system (e.g., other detectors may be included between the light source 104 and the detector 106, other detectors may be included in an unillustrated part of the sensor system). In some embodiments, the plurality of light sources and the plurality of detectors have a same pitch width (e.g., 86 µm, 54.9 µm, 46.1 µm a pitch width corresponding to a particular display resolution and/or display size). A spacing between a light source of the plurality of light sources and an adjacent detector of the plurality of detectors is half of the pitch width (e.g., 43 µm, 27.45 µm, 23.05 µm, half a pitch width corresponding to a particular display resolution and/or display size) (e.g., there is one detector between a light source pitch, there is one light source between a detector pitch). In some embodiments, the plurality of light sources and the plurality of detectors have a different pitch width (e.g., one detector between multiple light sources, one light source between multiple detectors).

In some embodiments, the light source 104 is one of the light sources configured to illuminate a position 114 of a user interaction, and the detector 106 is a detector configured to detect backscattered light 118 (e.g., light scattered or reflected from a position due to an illumination) from the position 114 (e.g., the detector 106 is located within a range where the backscattered light 118 may be detected by the detector 106). For example, the backscattered light may be reflected from a glass interface on the position 114 on the display, so the backscattered light may be more likely to be confined to a neighborhood surrounding the illuminated light source (e.g., the glass interface is a smooth surface), and the detector 106 is located within this neighborhood. As an example, the detector 106 is located within 0.74 mm from the light source 104 (e.g., for a glass material having a refractive index n=1.5 and thickness of 0.5 mm, the backscatter light may likely not reach beyond 0.74 mm from a corresponding illumination source). In some examples, if a cone angle of the illumination is not constrained, the detector 106 is located within a distance three times the cover glass 212 thickness (e.g., 1.5 mm for a 0.5 mm thick cover glass) from the light source 104.

In some embodiments, the electronic device of the sensor system 100 detects a user interaction with the display 102. For example, as illustrated, the display 102 detects a finger 108 on the display 102 (e.g., during fingerprint authentication, during fingerprint capture, providing a touch input to the electronic device). In the illustrated example, a portion of the finger 108 is illustrated and the fingerprint of the finger 108 includes fingerprint ridges 110. In some instances, the spacing between peaks of the fingerprint ridges 110 is 0.2-0.8 mm.

In some embodiments, the electronic device of the sensor system 100 determines a position of the user interaction on the display. For example, a position 114 of the user interaction on the display is a location of the finger 108 where the illumination 116 from the light source 104 meets the finger 108. As an example, a location and size of a fingerprint of the finger 108 is estimated by the electronic device to determine the position. In some embodiments, the position of the user interaction on the display is determined by a sensor of the electronic device. For example, the display 102 is a touch-sensitive display, and the touch sensors of the display 102 determines the position of the user interaction.

As another example, before identifying an image of the fingerprint of finger 108, the detector 106 detects the presence of a user interaction (e.g., a finger on a portion of the display 102). In some embodiments, the detector 106 detects the user interaction by detecting an area with reduced ambient lighting (e.g., a finger casts a shadow on the detector). In some embodiments, the detector 106 detects the user interaction by detecting display lighting (e.g., from light source 104) backscattered to the detector 106.

Although the position 114 is illustrated as a point on the finger 108, it is understood that the illustration is merely exemplary, and the position 114 may include more than one point on the finger 108 without departing from the scope of the disclosure. Additionally, although the position 114 is described to be a position of the user interaction on the display, it is understood that the user interaction does not exclusively include direct contact on the display. For example, the position of the user interaction on the display may include a portion of a finger not directly contacting the display, but the portion of the finger is sufficiently proximate to the display to create a backscattered light, from an illumination, to be detected by a detector.

In some embodiments, in response to determining the position of the user interaction, the electronic device illuminates the position on the display with the light source 104. For example, the light source 104 illuminates the position 114 with an illumination 116. Although FIG. 1 illustrates one illumination 116 from light source 104 illuminating the position 114 in the sensor system 100, more than one light source may generate more than one illumination to illuminate more than one position of a user interaction; methods and systems for illuminating more than one illumination from more than one light source on more than one position of the user interaction are described in more detail herein.

Although the illumination 116 is illustrated as one ray, it is understood that the illustration is merely exemplary, and the illumination 116 from a light source 104 may include more than one ray without departing from the scope of the disclosure. For example, the illumination 116 may span up to 23.5 degrees from a vertical axis perpendicular to the display 102 in the cover glass 112, and the illumination 116 may have an emission radius of 0.22 mm.

In some embodiments, the detector 106 detects a backscattered light from the position of the user interaction. For example, the detector 106 detects backscattered light 118 from the position 114. In some embodiments, signals (e.g., voltages of a photodiode) associated with the detected backscattered light are readout using, for example, the readout circuit and methods described with respect to FIGS. 4A, 4B, and 6.

In some embodiments, backscattered light in more than one direction may be created from the illumination 116 on the position 114; methods and systems for detecting backscattered light in more than on direction are described in more detail herein. In some embodiments, backscattered lights from more than one position of the user interaction may be created (e.g., from more than one illuminating light source); methods and systems for detecting backscattered lights from more than one position of the user interaction are described in more detail herein.

Although the backscattered light 118 is illustrated as one ray, it is understood that the illustration is merely exemplary, and the backscattered light 118 from the position 114 may include more than one ray without departing from the scope of the disclosure. For example, the backscattered light 118 may be described with a bidirectional reflectance distribution function (BRDF).

In some embodiments, the electronic device processes an image of the user interaction based on the detected backscattered light. For example, the backscattered light 118 is detected by the detector 106, and an image, as described with respect to FIG. 3, of the user interaction (e.g., corresponding to finger 108) at position 114 based on the detected backscattered light is processed by the electronic device. In some embodiments, processing an image of the user interaction includes transforming data associated with the detected backscattered light to form an image of the user interaction corresponding to the detected backscattered light (e.g., using the readout circuit 402, using a processor of the electronic device).

In some embodiments, processing an image of the user interaction includes performing an inverse calculation on the image. For example, an inverse calculation on the image includes scaling an area of the image (e.g., using a decimation function, using a demagnification function). As an example, the area of the image is scaled by ¼ (e.g., each dimension of the area of the image is scaled by ½). A specific example is described with respect to FIG. 3. In some embodiments, processing an image of the user interaction includes forming a constructed image of the user interaction.

In some embodiments, due to reflectance, when the backscattered light is received by a detector, dimensions of a corresponding image without an inverse calculation may be magnified by two and a resulting image of a fingerprint may be more accurate. As an exemplary advantage, by scaling the area of the image by one-fourth (e.g., each dimension of the area of the image is scaled by ½), a magnification effect of the fingerprint image is reduced, and a more accurate and/or less blurry image of the fingerprint may be formed, compared to an image without inverse calculation performed. Although scaling factors of ½ for a dimension and ¼ for an area are described, it is understood that other scaling factors may be used to reduce the effects of magnification. For example, if a dimension to be scaled is an odd number, the scaled dimension is rounded up or rounded down.

In some embodiments, the electronic device identifies a fingerprint of the user interaction based on the processed image. For example, based on the processed image (e.g., transforming data associated with the detected backscattered light to form an image of the user interaction, performing an inverse calculation, forming a constructed image of the user interaction), an image of the fingerprint of the finger 108 is identified by the electronic device. In some embodiments, the image of the fingerprint is used by the electronic device for other applications, such as authentication, fingerprint capture, image/document scanning, and pulse oximetry (e.g., using red light sources).

Although the sensor system 100 is described with respect to identifying a fingerprint image, it is understood that the sensor system 100 may not be limited to identifying the fingerprint image. For example, the sensor system 100 may be used to identify touch input by using the methods described herein, and advantageously reducing the need for additional touch detection hardware (e.g., hardware associated with a capacitive or a resistive touchscreen).

Figure 2:
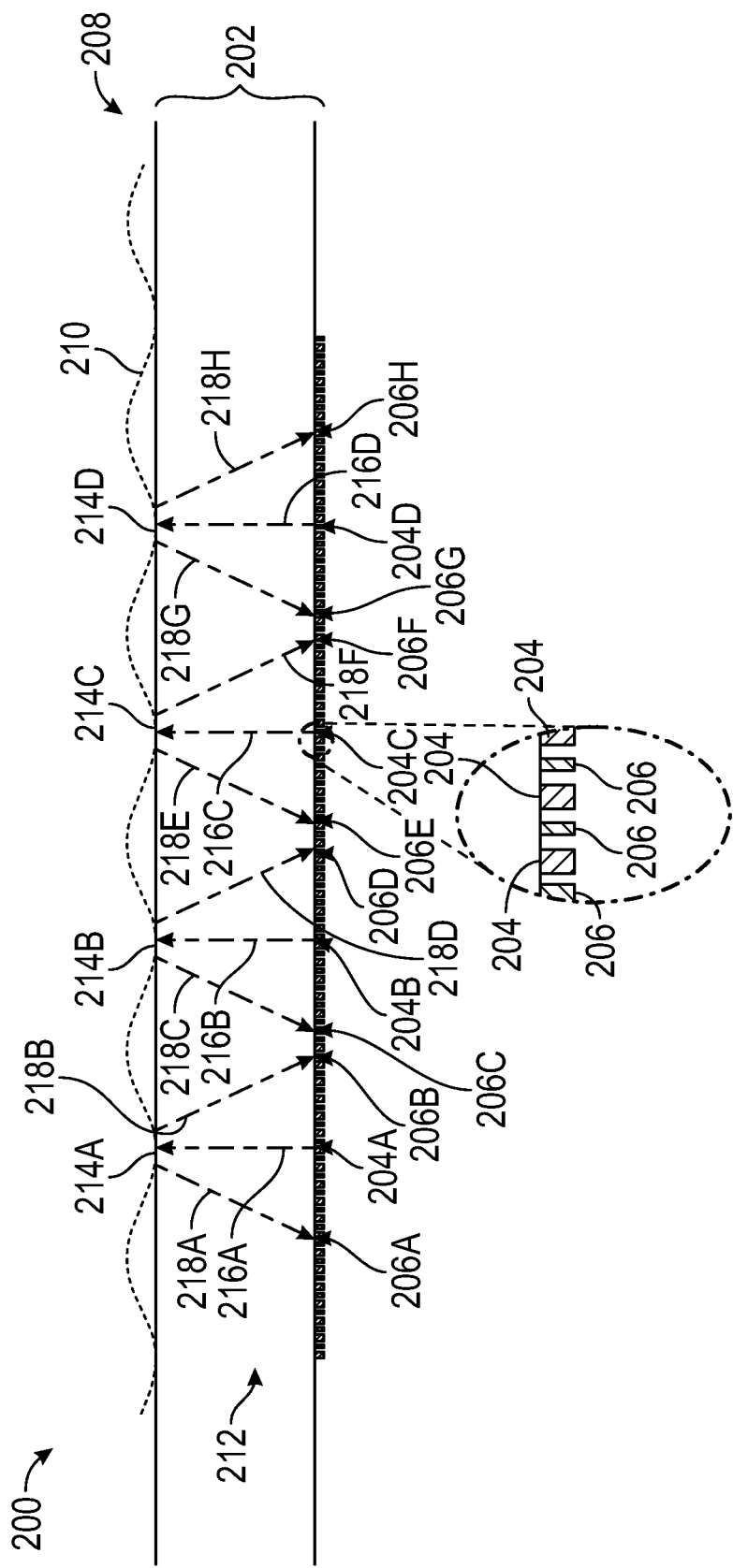
FIG. 2 illustrates an exemplary sensor system, according to embodiments of the disclosure.

FIG. 2 illustrates an exemplary sensor system 200, according to embodiments of the disclosure. In some embodiments, the sensor system 200 is configured to sense a fingerprint of finger 208. In some embodiments, the sensor system 200 includes a display 202, and the display 202 includes light sources 204, and detectors 206. In some embodiments, content (e.g., a GUI or media content on a mobile device, a GUI or media content on a display device) is presented on the display 202 by illuminating the light sources 204.

In some embodiments, the light sources 204 are OLEDs (e.g., green OLEDs of a display, red OLEDs of a display, blue OLEDs of a display), and the detectors 206 are photodiodes. For example, the photodiode is made with amorphous silicon as a detection material, and the p-type (e.g., boron doped), intrinsic part, and n-type (e.g., phosphorus doped) can be formed by deposition to implement a PIN structure for efficient detection (e.g., an entire area of the diode is used for detection). Anti-reflective coatings may be applied on top of the photodiode to minimize reflection to a viewer.

In some embodiments, an addressing scheme controls and reads out the signals sensed by the photodiodes. For example, each photodiode is reverse biased and connected to a switch (e.g., a low temperature polysilicon (LTPS) transistor). A column of such connected photodiodes is connected to a common column trace and such column traces (e.g., traces on a glass substrate) can then be readout by an external readout integrated circuit (e.g., readout circuit 404), using the systems and methods described with respect to FIGS. 4A, 4B, and 6, that performs signal amplification followed by analog-to-digital conversion (e.g., to generate an image of the user interaction).

In some embodiments, the display 202 includes a cover glass 212. In some embodiments, the light source 104 is one of the light sources 204, and the detector 106 is one of the detectors 206. In some embodiments, the cover glass 212 is a substrate for the light sources, detectors, and traces electrically coupled to the light source and the detector. In some embodiments, the traces are electrically coupled to a readout circuit (e.g., readout circuit 404). In some embodiments, the cover glass 212 has a thickness of 0.5 mm. For example, the area of the cover glass 112 has a diagonal dimension of 4 inches-15 inches.

Although the sensor system 200 is illustrated and described as having a particular configuration of light sources and detectors, it is understood that the illustration and descriptions are merely exemplary. Other configurations of light sources and detectors may be included in the disclosed sensor system. Although the sensor system 200 is illustrated along one direction, it is understood that the sensor system may span similarly in a different dimension (e.g., in a direction in and out of the page).

In some embodiments, the light sources 204 and the detector 206 are located on a same layer of the display 202. By locating the light sources 204 and the detectors 206 on a same layer of the display 202, the thickness and cost of the electronic device including the sensor system may be advantageously reduced. For example, by locating a light source and a detector on a same layer of the display to sense a fingerprint (e.g., by manufacturing the detecting photodiodes with the display OLEDs together), the display may function as a fingerprint sensor (e.g., using a same light source to present content on the electronic device and illuminate a position of a user interaction). A discrete fingerprint sensor (e.g., a physical discrete fingerprint sensing module, an ultrasonic fingerprint sensor) may not be needed to sense a fingerprint. Therefore, there would be no added thickness and cost from the discrete fingerprint sensor on the electronic device to sense a fingerprint. As another example, by using the display to function as a fingerprint sensor, the entire area of the display may be used to sense for the fingerprint (e.g., the fingerprint may be identified anywhere on the display), compared to a limited area when a discrete fingerprint sensor is used instead. As yet another example, by using the display to function as a fingerprint sensor, more than one fingerprint may be sensed, compared to a discrete fingerprint sensor configured to sense one fingerprint (e.g., due to cost and/or size limitations, the discrete sensor may have limited coverage area). Furthermore, the sensor system 200 advantageously may not require an optical imaging device such as collimators, lenses or aligned pinholes to identify a user interaction, keeping cost of the electronic device low and not adding to an overall thickness of a display.

In some embodiments, the light sources 204 and the detectors 206 have a same pitch width (e.g., 86 µm, 54.9 µm, 46.1 µm, a pitch width corresponding to a particular display resolution and/or display size). A spacing between a light source 204 and an adjacent detector is half of the pitch width (e.g., 43 µm, 27.45 µm, 23.05 µm, half a pitch width corresponding to a particular display resolution and/or display size) (e.g., there is one detector between a light source pitch, there is one light source between a detector pitch). In some embodiments, the plurality of light sources and the plurality of detectors have a different pitch width (e.g., one detector between multiple light sources, one light source between multiple detectors).

In some embodiments, the light sources 204A-204D are configured to illuminate positions 214A-214D of a user interaction with illuminations 216A-216D, respectively, and the detectors 206A-206H are detectors configured to detect backscattered light 218A-218H (e.g., light scattered or reflected from an illumination) from a respective position 214A-214D. In some embodiments, when illuminating together, the illuminations 216A-216D are spaced apart such that the corresponding backscattered light does not affect a detector associated with a different backscattered light. For example, the backscattered light may be reflected from a glass interface on the positions 214A-214D on the display, so the backscattered light may be more likely to be confined to a neighborhood surrounding the illuminated light source (e.g., the glass interface is a smooth surface), and the neighborhoods associated with the illuminations 216A-216D do not overlap. As an example, when illuminating together, light sources corresponding to the illuminations 216A and 216B are spaced apart such that the backscattered light 218B does not affect detectors configured to detect backscattered light 218C, and such that the backscattered light 218C does not affect detectors configured to detect backscattered light 218B. In some embodiments, based on a scattering distance as described with respect to FIG. 1, light sources corresponding to adjacent illuminations are at least 0.74 mm apart (e.g., the adjacent light sources are illuminating at different times). In some embodiments, based on a scattering distance, as described with respect to FIG. 1, light sources corresponding to adjacent illuminations are at least 1.48 mm apart (e.g., the adjacent light sources are illuminating at a same time). In some embodiments, light sources corresponding to adjacent illuminations are at least at a distance three times the thickness (e.g., 1.5 mm for a 0.5 mm thick cover glass) of the cover glass 212 apart. In some embodiments, detectors (e.g., detector 206A, detector 206B) are located within a distance three times the thickness (e.g., 1.5 mm for a 0.5 mm thick cover glass) of the cover glass 212 from a corresponding light source (e.g., light source 204A).

As described in more detail below, in some embodiments, the illuminations are generated at different times, and the backscattered light are detected with one detector at a time. In some embodiments, the illuminations are generated at a same time, and the backscattered light are detected with one detector at a time. In some embodiments, the illuminations are generated at different times, and the backscattered light corresponding to an illumination are detected at a same time. In some embodiments, the illuminations are generated at a same time, and the backscattered light from the illuminations are detected at a same time.

Although specific numbers of illuminations, positions, and backscattered light are described with respect to FIG. 2, it is understood that these numbers are merely exemplary. Any number of illuminations may be generated, any number of user interaction positions may be illuminated by the sensor system 200, and any number of backscattered light may be generated by the sensor system 200 or by the user interaction without departing from the scope of the disclosure. In some embodiments, these configurations depend on the user interaction. For example, the geometry (e.g., area, shape of the fingerprint ridges) of the fingerprint on the display determines the number of illuminations and positions, and the range of the backscattered light (e.g., neighborhoods associated with the illuminations) determines the amount and directions of backscattered light and the number of detectors used to detect the backscattered light.

In some embodiments, generally, a M number of light sources illuminate a M number of positions of a user interface and for each position, an N number of detectors are used to detect backscattered light from each position, such that M×N number of detectors are used to generate an image of the user interaction. In some embodiments, the M light sources are illuminated at different times. In some embodiments, portions of the M light sources are illuminated at different times. In some embodiments, the M light sources are illuminated at a same time. In some embodiments, the M×N detectors detect the backscattered light at different times (e.g., one at a time, at a group of N at a time, at portions of M×N at a time). In some embodiment, the M×N detectors detect the backscattered light at a same time. Some examples of light source illumination and detector detection are described below.

In some embodiments, the electronic device of the sensor system 200 detects a user interaction with the display 202. For example, as illustrated, the display 202 detects a finger 208 on the display 202 (e.g., during fingerprint authentication, during fingerprint capture, providing a touch input to the electronic device). In the illustrated example, a portion of the finger 208 is illustrated and the fingerprint of the finger 208 includes fingerprint ridges 210. In some instances, the spacing between peaks of the fingerprint ridges 210 is 0.2-0.8 mm.

In some embodiments, the electronic device of the sensor system 200 determines a position of the user interaction on the display. For example, a position 214 of the user interaction on the display is a location of the finger 208 where an illumination 216A-216D from a light source 204 meet the finger 208. As an example, a location and size of a fingerprint of the finger 208 is estimated by the electronic device to determine the position. In some embodiments, the position of the user interaction on the display is determined by a sensor of the electronic device. For example, the display 202 is a touch-sensitive display, and the touch sensors of the display 202 determines the position of the user interaction.

As another example, before identifying an image of the fingerprint of finger 208, the detectors 206 detect the presence of a user interaction (e.g., a finger on a portion of the display 202). In some embodiments, the detectors 206 detect the user interaction by detecting an area with reduced ambient lighting (e.g., a finger casts a shadow on the detector). In some embodiments, the detector 206 detects the user interaction by detecting display lighting (e.g., from light source 204) backscattered to the detectors 206.

Although the positions 214A-214D are illustrated as points on the finger 208, it is understood that the illustration is merely exemplary, and each of the positions 214A-214D may include more than one point on the finger 208 without departing from the scope of the disclosure. Additionally, although the positions 214A-214D are described to be positions of the user interaction on the display, it is understood that the user interaction does not exclusively include direct contact on the display. For example, the positions of the user interaction on the display may include a portion of a finger not directly contacting the display, but the portion of the finger is sufficiently proximate to the display to create a backscattered light, from an illumination, to be detected by a detector.

In some embodiments, in response to determining the position of the user interaction, the electronic device illuminates the positions on the display with the light sources 204A-204D. For example, the light sources 204A-204D illuminate the positions 214A-214D with illuminations 216A-216D, respectively.

Although each of the illuminations 216A-216D is illustrated as one ray, it is understood that the illustration is merely exemplary, and each of the illuminations 216A-216D from a respective light source 204A-204D may include more than one ray without departing from the scope of the disclosure. For example, the illuminations 216A-216D may span up to 23.5 degrees from a vertical axis perpendicular to the display 202 in the cover glass 212, and the illuminations 216A-216D may have emission radii of 0.22 mm.

In some embodiments, the detectors 206A-206H detect backscattered light from the positions 214A-214D of the user interaction. For example, corresponding detectors of the detectors 206A-206H detect backscattered light 218A-218H from the positions 214A-214D, respectively. In some embodiments, signals (e.g., voltages of a photodiode) associated with the detected backscattered light are readout using, for example, the readout circuit and methods described with respect to FIGS. 4A, 4B, and 6.

In some embodiments, illuminations are generated at different times, and backscattered light are detected with one detector at a time. For example, at a first time, a light source 204A illuminates position 214A with an illumination 216A. At a second time, a detector 206A detects backscattered light 218A. At a third time, a detector 206B detects backscattered light 218B. At a fourth time, a light source 204B illuminates position 214B with an illumination 216B. At a fifth time, a detector 206C detects backscattered light 218C. At a sixth time, a detector 206D detects backscattered light 218D. In some embodiments, this sequence continues until an image of the fingerprint of finger 208 is generated or identified. Although specific illuminations and detections are described, it is understood that the illuminations and detections are exemplary, and different illuminations and detections may be performed with the sensor system 200 to form an image of the user interaction.

In some embodiments, illuminations are generated at a same time, and backscattered light are detected with one detector at a time. For example, at a first time, light source 204A-204D illuminate positions 214A-214D with illuminations 216A-216D. At a second time, a detector 206A detects backscattered light 218A. At a third time, a detector 206B detects backscattered light 218B. At a fourth time, a detector 206C detects backscattered light 218C. At a fifth time, a detector 206D detects backscattered light 218D. In some embodiments, this sequence continues until an image of the fingerprint of finger 208 is generated or identified. By illuminating more than one light source 204 at a same time with illuminations 216A-216D, image of the fingerprint may be formed quicker, compared to illuminating one light source at a time, and backscattered light from the illuminations would not interfere with each other. Although specific illuminations and detections are described, it is understood that the illuminations and detections are exemplary, and different illuminations and detections may be performed with the sensor system 200 to form an image of the user interaction.

In some embodiments, illuminations are generated at different times, and backscattered light corresponding to an illumination are detected at a same time. For example, at a first time, a light source 204A illuminates position 214A with an illumination 216A. At a second time, detectors 206A-206B detect backscattered light 218A and 218B. At a third time, a light source 204B illuminates position 214B with an illumination 216B. At a fourth time, detectors 206C-206D detect backscattered light 218C and 218D. By detecting more than one backscattered light at a same time with the detectors, image of the fingerprint may be formed quicker, compared to detecting one backscattered light at a time. Although specific illuminations and detections are described, it is understood that the illuminations and detections are exemplary, and different illuminations and detections may be performed with the sensor system 200 to form an image of the user interaction.

In some embodiments, illuminations are generated at a same time, and backscattered light from the illuminations are detected at a same time. For example, at a first time, light sources 204A-204D illuminate positions 214A-214D with illuminations 216A-216D. At a second time, detectors 206A-206H detect backscattered light 218A-218H. By illuminating more than one light source 204 at a same time with illuminations 216A-216D and detecting more than one backscattered light (e.g., backscattered light 218A-218H) at a same time with the detectors, image of the fingerprint may be formed quicker, compared to illuminating one light source at a time, and backscattered light from the illuminations would not interfere with each other. Although specific illuminations and detections are described, it is understood that the illuminations and detections are exemplary, and different illuminations and detections may be performed with the sensor system 200 to form an image of the user interaction.

In some embodiments, the electronic device processes an image of the user interaction based on the detected backscattered light (e.g., from the examples described with respect to FIG. 2). For example, the backscattered light 218A-218H are detected by respective detectors 206A-206H, and an image, as described with respect to FIG. 3, of the user interaction (e.g., corresponding to finger 208) at positions 214A-214D based on the detected backscattered light is processed by the electronic device. In some embodiments, processing an image of the user interaction includes transforming data associated with the detected backscattered light to form an image of the user interaction corresponding to the detected backscattered light (e.g., using the readout circuit 402, using a processor of the electronic device). In some embodiments, to form an image of a user interaction, a different set of illuminations is generated and corresponding detectors detect the backscattered light from the different set of illuminations. In some embodiments, processing an image of the user interaction includes combining images (e.g., combining processed versions of images 302, as described with respect to FIG. 3) associated with the different sets of illuminations.

In some embodiments, processing an image of the user interaction includes performing an inverse calculation on the image. For example, an inverse calculation on the image includes scaling an area of the image (e.g., using a decimation function, using a demagnification function). As an example, the area of the image is scaled by ¼ (e.g., each dimension of the area of the area of the image is scaled by ½). A specific example is described with respect to FIG. 3. In some embodiments, processing an image of the user interaction includes forming a constructed image of the user interaction.

In some embodiments, due to reflectance, when the backscattered light is received by the detectors, dimensions of a corresponding image without an inverse calculation may be magnified by two and a resulting image of a fingerprint may be more accurate. As an exemplary advantage, by scaling the area of the image by one-fourth (e.g., each dimension of the area of the image is scaled by ½), a magnification effect of the fingerprint image is reduced, and a more accurate and/or less blurry image of the fingerprint may be formed, compared to an image without an inverse calculation performed. Although scaling factors of ½ for a dimension and ¼ for an area are described, it is understood that other scaling factors may be used to reduce the effects of magnification. For example, if a dimension to be scaled is an odd number, the scaled dimension is rounded up or rounded down.

In some embodiments, the electronic device identifies a fingerprint of the user interaction based on the processed image. For example, based on the processed image (e.g., transforming data associated with the detected backscattered light into an image of the user interaction, performing an inverse calculation, forming a constructed image of the user interaction), an image of the fingerprint of the finger 208 is identified by the electronic device. In some embodiments, the image of the fingerprint is used by the electronic device for other applications, such as authentication, fingerprint capture, image/document scanning, and pulse oximetry (e.g., using red light sources).

Although the sensor system 200 is described with respect to identifying a fingerprint image, it is understood that the sensor system 200 may not be limited to identifying the fingerprint image. For example, the sensor system 200 may be used to identify touch input by using the methods described herein, and advantageously reducing the need for additional touch detection hardware (e.g., hardware associated with a capacitive or a resistive touchscreen).

Figure 3:
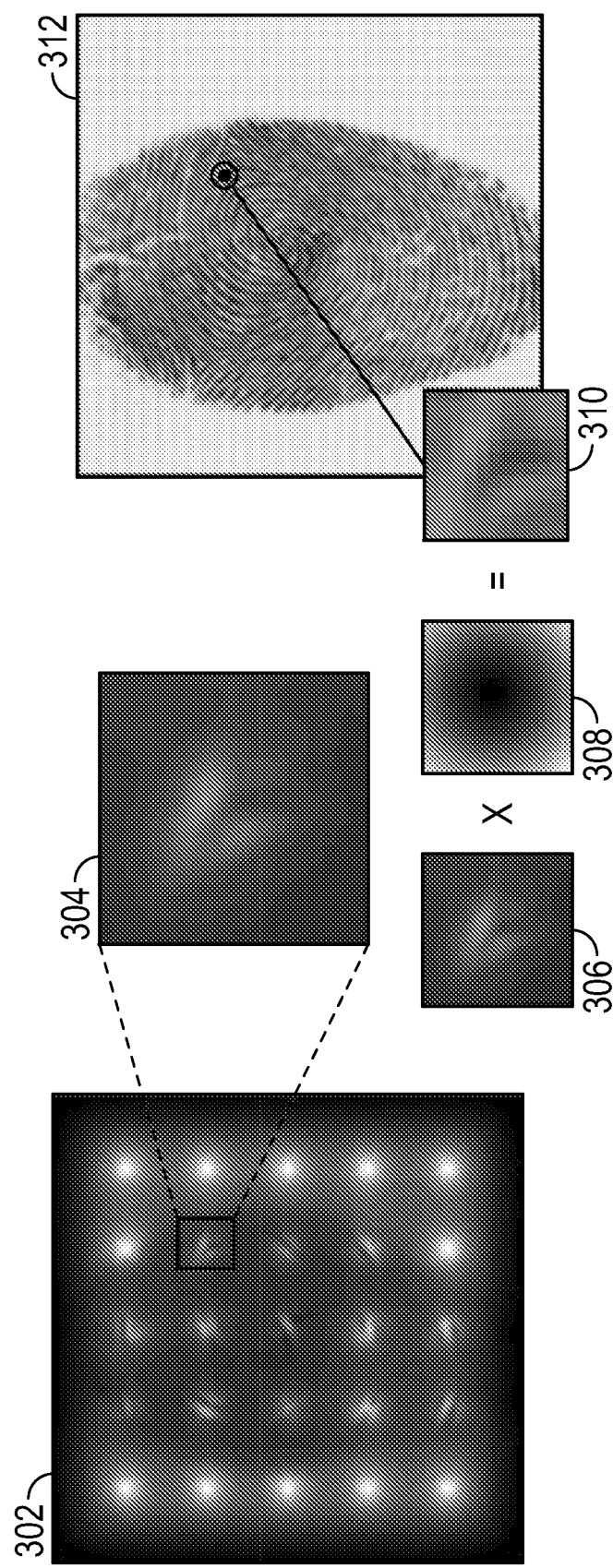
FIG. 3 illustrates exemplary image processing, according to embodiments of the disclosure.

FIG. 3 illustrates exemplary image processing, according to embodiments of the disclosure. In some embodiments, the image 302 corresponds to an area of a user interaction. For example, the user interaction is a 30 mm×30 mm area, and the area corresponds to a 350×350 array of light sources and a 350×350 array of detectors. The image 302 is formed by illuminating 5×5 light sources spanning the area toward positions of a user interaction and detecting with corresponding detectors (e.g., using the systems and methods described with respect to FIGS. 1, 2, 4, 5, and 6). In some embodiments, to form an image 312 of a fingerprint, multiple (e.g., 36) images 302 are taken, each image corresponds to different 5×5 light source locations (e.g., 6 different locations along the x direction and 6 different locations along the y direction).

In some embodiments, an image 302 includes image areas 304. For example, there are 25 image areas 304 (e.g., generated by the 5×5 light sources), and each image area 304 corresponds to an area (e.g., a 21×21 pixel area) of the image 302 generated an array of detectors detecting a backscattered light. Although the image area 304 is described as having a specific dimension, it is understood that the image area 304 may include other dimensions. In some embodiments, adjacent image areas 304 do not overlap. In some embodiments, adjacent image areas 304 overlap.

In some embodiments, each of the image areas 304 is processed, and processing the images includes performing an inverse calculation on the images. For example, an inverse calculation on the image includes scaling an area of the image (e.g., using a decimation function, using a demagnification function). As illustrated, the image area 304 is scaled by ¼ (e.g., each dimension of the area of the image is scaled by ½). For example, each image area 304 has an area of 21×21 pixels. After the inverse calculation is performed, an image 306 is generated. For example, the image 306 has a size of 11×11 pixels after the inverse calculation is performed. It is understood that the sizes of the image area 304 and the image 306 are merely exemplary.

In some embodiments, due to reflectance, when the backscattered light is received by the detectors, dimensions of a corresponding image without an inverse calculation may be magnified by two and a resulting image of a fingerprint may be more accurate. As an exemplary advantage, by scaling the area of the image by one-fourth (e.g., each dimension of the area of the image is scaled by ½), a magnification effect of the fingerprint image is reduced, and a more accurate and/or less blurry image of the fingerprint may be formed, compared to an image without an inverse calculation performed.

In some embodiments, weight 308 is an illustrative representation of a weight applied to image 306. In some embodiments, by applying the weight 308 on image 306 (e.g., by multiplying each set of corresponding pixels), a calculated image 310 is generated. In some embodiments, the weight 308 is configured to correct illumination non-uniformity. In some embodiments, the weight 308 is obtained by calculating an inverse of an average of the pixels of the image 306. As an exemplary advantage, recovery of the user interaction is improved by using the weight 308 and compensating for non-uniformity of each light source (e.g., a grid in the calculated image 310 due to illumination pattern may be reduced by reducing a boundary of the image 306).

In some embodiments, the calculated image 310 corresponds to a portion of an image of the user interaction, and the calculated images 310 are combined to form the image of the user interaction. In some embodiments, the image of the user interaction is created by combining the calculated images 310 corresponding to all images 302. For example, the image 302 includes 25 calculated images 310 (e.g., from the 5×5 light sources and generated in accordance with the above descriptions), and 36 images 302 are taken (e.g., from 36 different locations of 5×5 light sources). The 36×25 calculated images 310 are combined to form the image 312 of the fingerprint. In some embodiments, the user interaction is identified based on the image 312.

Although FIG. 3 is illustrated and described as including the described steps and elements, it is understood that different order of steps, additional steps, or less steps may be performed to generate the image of the user interaction or identify the user interaction without departing from the scope of the disclosure.

Figure 4A:
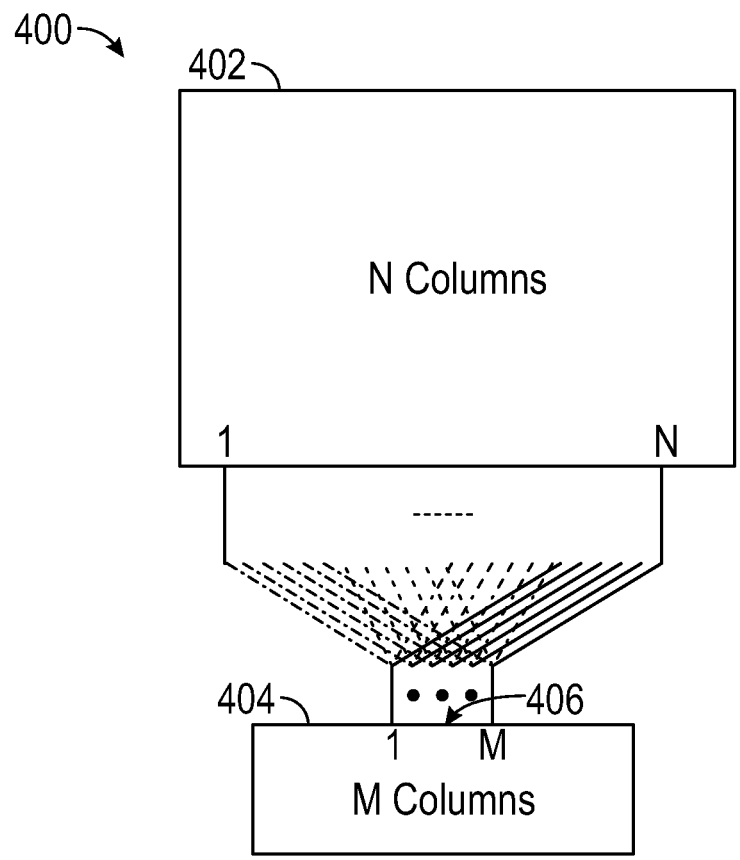
FIG. 4A illustrates an exemplary electronic device, according to embodiments of the disclosure.

FIG. 4A illustrates an exemplary electronic device 400, according to embodiments of the disclosure. In some embodiments, the electronic device 400 includes a display 402 and a readout circuit 404.

In some embodiments, the display 402 is display 102 or display 202. In some embodiments, the display 402 is a display having N columns of light sources (e.g., light source 104, light sources 204, OLEDS) and detectors (e.g., detector 106, detectors 206, photodiodes). For example, the display 402 is a HD display having 1920 columns of light sources and detectors.

In some embodiments, the readout circuit 404 is electrically coupled to the display 402 and is configured to readout signals (e.g., sample a voltage of a photodiode, amplify the signal, perform analog-to-digital conversion on the signal) detected from the detectors of the display 402. In some embodiments, the readout signals are used to form images described with respect to FIG. 3 to create an image of a user interaction or to identify a user interaction. In some embodiments, the readout circuit 404 includes an M number of columns.

In some embodiments, to reduce the size and cost of the readout circuit while allowing an entire display to sense for a user interaction, the readout circuit 404 includes an M number of columns less than an N number of columns in the display 402. That is, in some embodiments, each of the N numbers of columns in the display 402 is not always electrically coupled to a column of the readout circuit 404.

In some embodiments, the readout circuit 404 includes multiplexers 406. The multiplexers 406 allow the N columns of the display 402 to be read by the M columns of the readout circuit 404, advantageously allowing the size and cost of the readout circuit 404 to be reduced while allowing an entire display to sense for a user interaction.

As an example, the display 402 is a HD display including 1920 columns of light sources and detectors, and the readout circuit 404 includes 480 columns. The light sources and detectors are located on a glass substrate, and the 1920 columns include crossovers (e.g., traces on a glass that cross over each other). The readout circuit 404 would include 480 4-to-1 multiplexers 406, each of the 4-to-1 multiplexer is configured to selectively electrically couple one of four columns of the display 402 to a column of the readout circuit 404 for readout, such that 480 columns of the display are readout at one time. In some embodiments, the multiplexers 406 in this example are located on the glass substrate and include TFTs. The display 402 is divided into four groups of 480 columns, and each of the columns in the each group of the 480 columns is electrically coupled to a column input of a multiplexer 406. As an exemplary advantage, because 480 columns may be read at a same time, the entire display 402 may be scanned for a user interaction in four readout times (e.g., 67 ms for a 60 Hz display refresh rate) while the size and cost of the readout circuit are reduced, compared to a readout circuit having 1920 columns. In some embodiments, the display includes more than one unique pixel settings. In the 4-to-1 multiplexer example, the entire display would be scanned in [4×(number of unique pixel settings)] frames.

For example, a first multiplexer is electrically coupled to a first column of the readout circuit 404 and a second multiplexer is electrically coupled to a second column of the readout circuit 404. The first column of the display is electrically coupled a first column input of a first multiplexer, the $481^{st}$ column of the display is electrically coupled to a second column input of the first multiplexer, the $961^{st}$ column of the display is electrically coupled to a third column input of the first multiplexer, the $1441^{st}$ column of the display is electrically coupled to a fourth column input of the first multiplexer, the second column of the display is electrically coupled a first column input of a second multiplexer, the $482^{nd}$ column of the display is electrically coupled to a second column input of the second multiplexer, the $962^{nd}$ column of the display is electrically coupled to a third column input of the second multiplexer, the $1442^{nd}$ column of the display is electrically coupled to a fourth column input of the second multiplexer, and so on.

In some embodiments, at a first time, the first multiplexer is selectively electrically coupled to a first column of the display for readout, the second multiplexer is selectively electrically coupled to a second column of the display for readout, and so on. At a second time, after the readout of the first column of the display is completed, the first multiplexer selectively electrically couples the $481^{st}$ column to the first column of the readout circuit for readout. At the second time or at a third time, after the readout of the second column of the display is completed, the second multiplexer selectively electrically couples the $482^{st}$ column to the second column of the readout circuit for readout, and so on, until all 1920 columns of the display are readout before the entire display is scanned again (e.g., the first column of the display is readout again). In some embodiments, a time period between readouts of the first column of the display (e.g., a period of scanning an entire display) is less than 67 ms for a 60 Hz display refresh rate.

As another example, the display 402 is a HD display including 1920 columns of light sources and detectors, and the readout circuit 404 includes 960 columns. The light sources and detectors are located on a glass substrate, and the 1920 columns include crossovers (e.g., traces on a glass that cross over each other). The readout circuit 404 would include 960 2-to-1 multiplexers 406, each of the 2-to-1 multiplexer is configured to selectively electrically couple one of two columns of the display 402 to a column of the readout circuit 404 for readout, such that 960 columns of the display are readout at one time. In some embodiments, the multiplexers 406 in this example are located on the glass substrate and include TFTs. The display 402 is divided into two groups of 960 columns, and each of the columns in the each group of the 960 columns is electrically coupled to a column input of a multiplexer 406. The method of reading out the columns of the display in this example is similar to the one described with respect to the 4-to-1 multiplexer example and is not repeated here. As an exemplary advantage, because 960 columns may be read at a same time, the entire display 402 may be scanned for a user interaction in two readout times (e.g., 33.5 ms for 60 Hz display refresh rate) while the size and cost of the readout circuit are reduced, compared to a readout circuit having 1920 columns.

As yet another example, the display 402 is a HD display including 1920 columns of light sources and detectors, and the readout circuit 404 includes 15 columns. As an exemplary advantage, the size and cost of the readout circuit are reduced, compared to a readout circuit having 1920 columns. The readout circuit 404 would include 15 128-to-1 multiplexers 406, each of the 128-to-1 multiplexer is configured to selectively electrically couple one of 128 columns of the display 402 to a column of the readout circuit 404 for readout, such that 15 columns of the display are readout at one time. The display 402 is divided into 128 groups of 15 columns, and each of the columns in the each group of the 15 columns is electrically coupled to a column input of a multiplexer 406. The method of reading out the columns of the display in this example is similar to the one described with respect to the 4-to-1 multiplexer example and is not repeated here.

Generally, in some embodiments, the display 402 includes N columns of light sources and detectors, and the readout circuit 404 includes M columns. The readout circuit 404 would include M number of (N/M)-to-1 multiplexers 406, each of the (N/M)-to-1 multiplexer is configured to selectively electrically couple one of M columns of the display 402 to a column of the readout circuit 404 for readout, such that M columns of the display are readout at one time. The display 402 is divided into (N/M) groups of M columns, and each of the columns in the each group of the M columns is electrically coupled to a column input of a multiplexer 406. The method of reading out the columns of the display in this example is similar to the one described with respect to the 4-to-1 multiplexer example and is not repeated here.

In some embodiments, a portion of the display 402 is scanned for a user interaction. For example, the portion of the display 402 correspond to a size of a fingerprint to be scanned. In accordance with a determination of the size and/or location of the fingerprint to be scanned (e.g., using the methods described herein), corresponding columns would be selectively electrically coupled (e.g., using the multiplexers 406) to the readout circuit 404 for readout. For example, the size of the fingerprint is 300 pixels wide and covers columns 301 to 600 of the display. In accordance with a determination that the size and location of the fingerprint, columns 301 to 600 of the display would be selectively electrically coupled, using the multiplexer examples described herein, to the readout circuit 404 for readout.

Figure 4B:
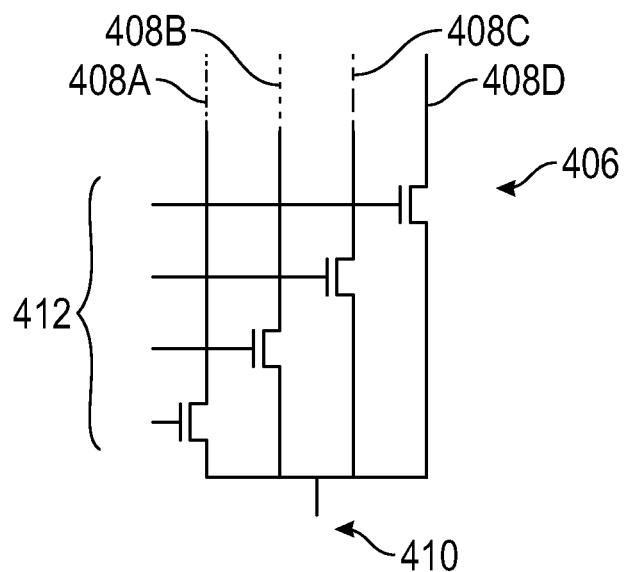
FIG. 4B illustrates an exemplary multiplexer, according to embodiments of the disclosure.

FIG. 4B illustrate an exemplary multiplexer 406, according to embodiments of the disclosure. In some embodiments, the multiplexer 406 is a 4-to-1 multiplexer, as described with respect to FIG. 4A. In some embodiments, the multiplexer 406 is located on the glass substrate and includes TFTs. In some embodiments, the 4-to-1 multiplexer includes column inputs 408A-408D. In some embodiments, based on the control signals 412 (e.g., generated based on address decoding), a column input 408A-408B is selectively electrically coupled to the output 410, which is electrically coupled to a column of the readout circuit 404 for readout of a corresponding display column.

For example, the multiplexer 406 is a first multiplexer of the readout circuit 404. The first column of the display is electrically coupled the column input 408A, the $481^{st}$ column of the display is electrically coupled to the column input 408B, the $961^{st}$ column of the display is electrically coupled to the column input 408C, and the $1441^{st}$ column of the display is electrically coupled to the column input 408D. In some embodiments, the control signals 412 selectively electrically couples a column input 408A-408D to the output 410 of the multiplexer based on the exemplary 4-to-1 multiplexer readout method described with respect to FIG. 4A.

Although FIGS. 4A and 4B are illustrated and described as including the described elements, it is understood that different configurations elements may be used to generate the image of the user interaction or identify the user interaction without departing from the scope of the disclosure.

Figure 5:
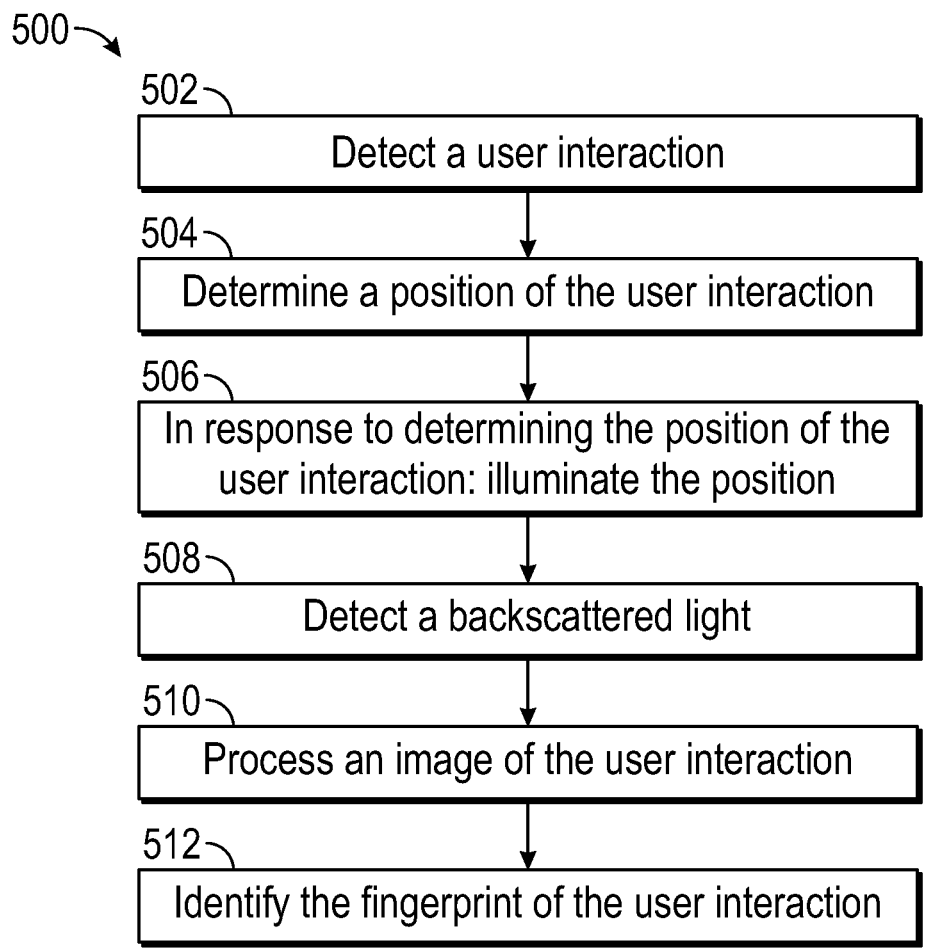
FIG. 5 illustrates an exemplary method of operating a sensor system, according to embodiments of the disclosure.

FIG. 5 illustrates an exemplary method 500 of operating a sensor system, according to embodiments of the disclosure. In some embodiments, the method 500 is a method of operating the sensor system 100, the sensor system 200, or the electronic device 400. In some embodiments, the method 500 is a method of generating images described with respect to FIG. 3. Although the method 500 is illustrated as including the described steps, it is understood that different order of steps, additional steps, or less steps may be performed to operate an exemplary sensor system without departing from the scope of the disclosure. For example, steps of method 500 may be performed with steps of method 600.

In some embodiments, the method 500 includes detecting, with the display, a user interaction with the display (step 502). For example, as described with respect to FIGS. 1 and 2, the electronic device detects a user interaction (e.g., finger 108 or finger 208 on the display) with the display 102 or display 202.

In some embodiments, the method 500 includes determining a position of the user interaction on the display (step 504). For example, as described with respect to FIGS. 1 and 2 and using the systems and methods described herein, the electronic device determines a position of the user interaction on the display 102 or display 202.

In some embodiments, the method 500 includes in response to determining the position of the user interaction, illuminating, with a light source, the position on the display (step 506). For example, as described with respect to FIG. 1, in response to determining the position of the user interaction, the light source 104 illuminates the position on the display 102. As another example, as described with respect to FIG. 2, in response to determining the position of the user interaction, the light sources 204 illuminate (e.g., at a same time, at different times) the positions 214A-214D on the display 202.

In some embodiments, the method 500 includes detecting, with the detector, a backscattered light from the position (step 508). For example, as described with respect to FIG. 1, the detector 106 detects backscattered light 118 from the position 114. As another example, as described with respect to FIG. 2, the detectors 206A-206H detect (e.g., at a same time, at different times) backscattered light 218A-218H from the positions 214A-214D, respectively.

In some embodiments, the method 500 includes processing, based on the detected backscattered light, an image of the user interaction (step 510). For example, as described with respect to FIG. 3, the electronic device processes an image (e.g., image 302, image area 304) based on backscattered light detected by a detector (e.g., detector 106) or detectors (e.g., detectors 206).

In some embodiments, processing the image of the user interaction includes scaling an area of the image by one-fourth (e.g., using a decimation function, using a demagnification function). For example, as described with respect to FIG. 3, the image area 304 is scaled by ¼ (e.g., each dimension of the area of the image is scaled by ½). For example, each image area 304 has an area of 21×21 pixels. After the inverse calculation is performed, an image 306 or a calculated image 310 is generated. For example, the image 306 or the calculated image 310 has a size of 11×11 pixels after the inverse calculation is performed. In some embodiments, the image 306 is processed, by applying weight 308, to generate calculated image 310 to reduce the effects of illumination non-uniformity from the light sources. In some embodiments, processing the image of the user interaction includes combining areas of the image. For example, the calculated images 310 (e.g., from all images 302 that are taken) are combined to form image 312 of the fingerprint.

In some embodiments, the method 500 includes identifying, based on the image, a fingerprint of the user interaction (step 512). For example, as described with respect to FIG. 3, the electronic device generates image 312 of a user interaction (e.g., a fingerprint), and based on the image 312, the user interaction is identified (e.g., authentication, fingerprint capture, image/document scanning, pulse oximetry (e.g., using red light sources)).

In some embodiments, the method 500 includes illuminating, with a second light source of the display, the second position on the display. For example, as described with respect to FIG. 2, light sources 204A-204B illuminate illumination 216A-216D toward the positions 214B-214D, respectively, in addition to illumination 216A. In some embodiments, as described with respect to FIG. 2, the illuminations 214A-214D are generated at a same time.

In some embodiments, the method 500 includes detecting, with a second detector of the display, a second backscattered light from the second position. For example, as described with respect to FIG. 2, detectors 206A-206H detect backscattered light 218C-218H. In some embodiments, processing the image of the user interaction is based on the second detected second backscattered light. For example, as described with respect to FIGS. 2 and 3, the image of the user interaction (e.g., image 302, image area 304) being processed is based on the detected backscattered light 218A-218H.

In some embodiments, the method 500 includes detecting, with a second detector of the display, a second backscattered light from the position. In some embodiments, processing the image of the user interaction is further based on the detected second backscattered light. For example, as described with respect to FIGS. 2 and 3, detectors 206A-206B detect backscattered light 218A and 218B at a same time, and an image of the user interaction (e.g., image 302, image area 304) based on the detected backscattered light is processed based on the detected backscattered light 218A-218B.

In some embodiments, the method 500 includes illuminating, with a second light source of the display a second position on the display. For example, as described with respect to FIG. 2, light sources 204A-204D illuminate illumination 216A-216D toward the positions 214B-214D, respectively, at a same time.

In some embodiments, the method 500 includes detecting, with third and fourth detectors of the display, third and fourth backscattered lights from the second position, respectively. In some embodiments, processing the image of the user interaction is based on the third and fourth backscattered lights. For example, as described with respect to FIGS. 2 and 3, detectors 206A-206H detect backscattered light 218A-218H at a same time, and an image of the user interaction (e.g., image 302, image area 304) based on the detected backscattered light 218A-218H is processed.

In some embodiments, the method 500 includes determining a second position of the user interaction on the display. In some embodiments, the first position corresponds to the first fingerprint, and the second position corresponds to the second fingerprint. For example, a second position associated with a second finger is determined by the electronic device, using the methods and systems described herein.

In some embodiments, the method 500 includes in response to determining the second position of the user interaction: illuminating, with a second light source of the display, the second position on the display. For example, a second light source of the display illuminates a second position associated with a second finger on the display.

In some embodiments, the method 500 includes detecting, with a second detector of the display, a second backscattered light from the second position. For example, a detector of the display detects a second backscattered light from the second position associated with the second finger on the display.

In some embodiments, the method 500 includes processing, based on the detected second backscattered light, a second image of the user interaction. For example, an image (e.g., a second image 302 associated with a second finger) associated with the second finger is generated and processed, as described with respect to FIG. 3.

In some embodiments, identifying, based on the second image, a second fingerprint of the user interaction. For example, as described with respect to FIG. 3, based on the image (e.g., a second image 302 associated with a second finger) associated with the second finger and a processed image associated with the second finger (e.g., a second image 312), a second fingerprint of the user interaction is identified.

In some embodiments, the first and second positions on the display are different. For example, a first portion of the display associated with a first position of the user interaction does not overlap with a second portion of the display associated with a second position of the user interaction.

Figure 6:
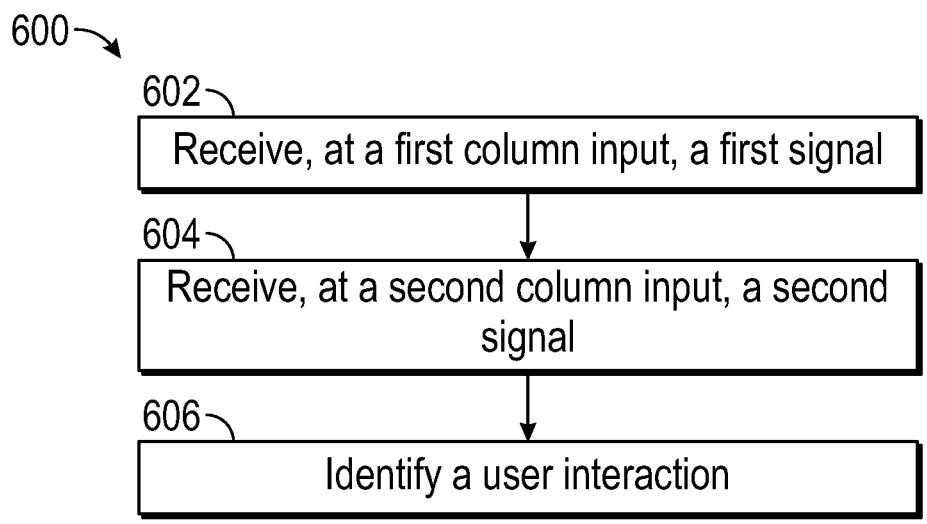
FIG. 6 illustrates an exemplary method of operating an electronic device, according to embodiments of the disclosure.

FIG. 6 illustrates an exemplary method 600 of operating an electronic device, according to embodiments of the disclosure. In some embodiments, the method 600 is a method of operating the sensor system 100, the sensor system 200, or the electronic device 400. In some embodiments, the method 600 is a method of generating images described with respect to FIG. 3. Although the method 600 is illustrated as including the described steps, it is understood that different order of steps, additional steps, or less steps may be performed to operate an exemplary sensor system without departing from the scope of the disclosure. For example, steps of method 600 may be performed with steps of method 500.

In some embodiments, the method 600 includes receiving, at a first column input of a multiplexer, a first signal associated with a detected first backscattered light (step 602). For example, as described with respect to FIGS. 4A and 4B, a first column input (e.g., column input 408A) of a multiplexer (e.g., multiplexer 406) is selectively electrically coupled to an output (e.g., output 410) of the multiplexer and a column of a readout circuit (e.g., readout circuit 404) to readout a first signal of an electrically coupled detector detecting a first backscattered light.

In some embodiments, the method 600 includes receiving, at a second column input of the multiplexer, a second signal associated with a detected second backscattered light (step 604). For example, as described with respect to FIGS. 4A and 4B, a second column input (e.g., column input 408B) of the multiplexer (e.g., multiplexer 406) is selectively electrically coupled to the output (e.g., output 410) of the multiplexer and the column of the readout circuit (e.g., readout circuit 404) to readout a second signal of an electrically coupled detector detecting a second backscattered light. As an example, as described with respect to FIGS. 4A and 4B, after the readout of the first column (e.g., through the first column input to output 410) of the display is completed, the first multiplexer selectively electrically couples the $481^{st}$ column to the first column of the readout circuit for readout (e.g., through the second column input to output 410).

In some embodiments, the method 600 includes identifying a user interaction based on the first signal and the second signal (step 606). For example, as described with respect to FIG. 3, the electronic device generates image 312 of a user interaction (e.g., a fingerprint), and based on the image 312, the user interaction is identified (e.g., authentication, fingerprint capture, image/document scanning, pulse oximetry (e.g., using red light sources)). The image 312 is generated based combining frames from each phase of a readout (e.g., a phase of a readout corresponds to a time when a group of columns readout), which is generated based on the systems and methods described with respect to FIGS. 4A and 4B and steps of method 600.

In some embodiments, the method 600 includes processing, based on the detected second backscattered light, an image of the user interaction. In some embodiments, the first signal is associated with a first frame of the image, the second signal is associated with a second frame of the image, and processing the image of the user interaction includes combining the first frame and the second frame. For example, the first signal received by a first column input of the multiplexer is associated with a first portion (e.g., a first frame) of an image of the user interaction, and the second signal received by a second column input of the multiplexer is associated with a second portion (e.g., a second frame) of the image of the user interaction.

In some embodiments, the method 600 includes receiving, at the first column input, a third signal associated with a detected third backscattered light, and a time between the receiving of the first signal and the receiving of the third signal is less than 67 ms for a 60 Hz display refresh rate. For example, as described with respect to FIGS. 4A and 4B, a period of scanning an entire display is less than 67 ms for a 60 Hz display refresh rate.

In some embodiments, an electronic device (e.g., an electronic device of a sensor system described herein) includes: a processor; a memory; a display including a light source and a detector, wherein the electronic device displays content on the display by illuminating the display with the light source; and a program stored in the memory, configured to be executed by the processor, and including instructions for performing the methods described with respect to FIGS. 1-6.

In some embodiments, a non-transitory computer readable storage medium stores one or more programs, and the one or more programs includes instructions. When the instructions are executed by an electronic device (e.g., an electronic device of a sensor system described herein) with one or more processors and memory, the instructions cause the electronic device to perform the methods described with respect to FIGS. 1-6.

In one aspect, a method includes: at an electronic device including a display, the display including a light source and a detector, wherein the electronic device displays content on the display by illuminating the display with the light source: detecting, with the display, a user interaction with the display; determining a position of the user interaction on the display; in response to determining the position of the user interaction: illuminating, with the light source, the position on the display; detecting, with the detector, a backscattered light from the position; processing, based on the detected backscattered light, an image of the user interaction; and identifying, based on the image, a fingerprint of the user interaction.

In some aspects of the above method, the method further includes: illuminating, with a second light source of the display, a second position on the display; and detecting, with a second detector of the display, a second backscattered light from the second position. Processing the image of the user interaction is based on the detected second backscattered light.

In some aspects of the above methods, the method further includes detecting, with a second detector of the display, a second backscattered light from the position. Processing the image of the user interaction is further based on the detected second backscattered light.

In some aspects of the above methods, the method further includes: illuminating, with a second light source of the display, a second position on the display; and detecting, with third and fourth detectors of the display, third and fourth backscattered lights from the second position, respectively. Processing the image of the user interaction is based on the third and fourth backscattered lights.

In some aspects of the above methods, the electronic device includes a readout circuit and a multiplexer including a first column input and a second column input, and the multiplexer is electrically coupled to the readout circuit. The method further includes receiving, at the first column input, a first signal associated with the detected first backscattered light; and receiving, at the second column input, a second signal associated with a detected second backscattered light.

In some aspects of the above methods, the method further includes processing, based on the detected second backscattered light, a second image of the user interaction. The first signal is associated with a first frame of the image; the second signal is associated with a second frame of the image; and processing the image of the user interaction includes combining the first frame and the second frame.

In some aspects of the above methods, the method further includes receiving, at the first column input, a third signal associated with a detected third backscattered light, wherein a time between the receiving of the first signal and the receiving of the third signal is less than 67 ms.

In some aspects of the above methods, processing the image of the user interaction includes scaling an area of the image by one-fourth.

In some aspects of the above methods, the light source and the detector are located on a same layer of the display.

In some aspects of the above methods, the display includes a plurality of light sources and detectors, the light sources and the detectors have same pitch widths, the plurality of light sources include the light source, the plurality of detectors include the detector, and the light source is located at a half pitch width from the detector.

In some aspects of the above methods, the method further includes: determining a second position of the user interaction on the display; in response to determining the second position of the user interaction: illuminating, with a second light source of the display, the second position on the display; detecting, with a second detector of the display, a second backscattered light from the second position; processing, based on the detected second backscattered light, the image of the user interaction; and identifying, based on the image, a second fingerprint of the user interaction. The first position corresponds to the first fingerprint, and the second position corresponds to the second fingerprint.

In some aspects of the above methods, the light source is located within a distance less than three times a thickness of a cover glass of the display from the detector.

In some aspects of the above methods, the display includes a plurality of light sources, the detector is located within a range of the backscattered light, the plurality of light sources include the first light source and a second light source, the second light source located within the range of the backscattered light, and the method further includes: in response to illuminating the position on the display with the first light source, forgoing illuminating with the second light source.

In one aspect, a non-transitory computer readable storage medium stores one or more programs, and the one or more programs includes instructions, which when executed by an electronic device with one or more processors and memory, cause the device to perform any of the above methods.

In one aspect, an electronic device includes: a processor; a memory; a display including a light source and a detector, wherein the electronic device displays content on the display by illuminating the display with the light source; and a program stored in the memory, configured to be executed by the processor, and including instructions for performing any of the above methods.

Although "electrically coupled" and "coupled" are used to describe the electrical connections between two elements of a circuit in this disclosure, it is understood that the electrical connections do not necessarily need direct connection between the terminals of the components being coupled together. Different combinations and connections of the recited components can achieve electrical coupling without departing from the scope of this disclosure. For example, electrical routing connects between the terminals of the components being electrically coupled together. In another example, a closed (conducting) switch is connected between the terminals of the components being coupled together. In yet another example, additional elements connect between the terminals of the components being coupled together without affecting characteristics of the circuit. For example, buffers, amplifiers, and passive circuit elements can be added without affecting the characteristics of the readout circuit and departing from the scope of this disclosure.

Similarly, when two elements of a circuit are described to be electrical disconnected in this disclosure, it is understood that electrical disconnects do not necessarily need to be physically open between the terminals of the components being switched. It is also understood that the disconnect is not limited to mean prevention of electrical energy transfer between two elements. For example, high-impedance elements are connected between the terminals of the components being uncoupled. In another example, an opened (non-conducting) switch is connected between the terminals of the components being uncoupled, effectively uncoupling the components.

Although some elements or quantities are described in an absolute sense without the term "substantially", it is understood that these elements and quantities can have qualities that are functionally equivalent to the absolute descriptions. For example, in some embodiments, a scaling factor is described as being one-half or one-fourth. However, it is understood that the ratio can be greater or less than one-half or one-fourth, as long as the ratio is within a tolerance of the system (e.g., accuracy requirements, etc.).

Although the disclosed embodiments have been fully described with reference to the accompanying drawings, it is to be noted that various changes and modifications will become apparent to those skilled in the art. Such changes and modifications are to be understood as being included within the scope of the disclosed embodiments as defined by the appended claims.

The terminology used in the description of the various described embodiments herein is for the purpose of describing particular embodiments only and is not intended to be limiting. As used in the description of the various described embodiments and the appended claims, the singular forms "a", "an," and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

We claim:

1. A method, comprising:
at an electronic device comprising a display, the display comprising a light source and a detector, wherein the electronic device displays content on the display by illuminating the display with the light source:
detecting, with the display, a user interaction with the display;
determining a position of the user interaction on the display;
in response to determining the position of the user interaction: illuminating, with the light source, the position on the display;
detecting, with the detector, a backscattered light from the position;
processing, based on the detected backscattered light, an image of the user interaction; and
identifying, based on the image, a fingerprint of the user interaction wherein:
the display comprises a plurality of light sources and detectors,
the light sources and the detectors have same pitch widths,
the plurality of light sources includes the light source,
the plurality of detectors includes the detector, and
the light source is located at a half pitch width from the detector.

2. The method of claim 1, further comprising:
illuminating, with a second light source of the display, a second position on the display; and
detecting, with a second detector of the display, a second backscattered light from the second position, wherein:
processing the image of the user interaction is based on the detected second backscattered light.

3. The method of claim 1, further comprising
detecting, with a second detector of the display, a second backscattered light from the position, wherein processing the image of the user interaction is further based on the detected second backscattered light.

4. The method of claim 3, further comprising:
illuminating, with a second light source of the display, a second position on the display; and
detecting, with third and fourth detectors of the display, third and fourth backscattered lights from the second position, respectively, wherein:
processing the image of the user interaction is based on the third and fourth backscattered lights.

5. The method of claim 1, wherein:
the electronic device comprises a readout circuit and a multiplexer comprising a first column input and a second column input, and
the multiplexer is electrically coupled to the readout circuit, the method further comprising:
receiving, at the first column input, a first signal associated with the detected first backscattered light; and
receiving, at the second column input, a second signal associated with a detected second backscattered light.

6. The method of claim 5, further comprising
processing, based on the detected second backscattered light, a second image of the user interaction, wherein:
the first signal is associated with a first frame of the image;
the second signal is associated with a second frame of the image; and
processing the image of the user interaction comprises combining the first frame and the second frame.

7. The method of claim 5, further comprising
receiving, at the first column input, a third signal associated with a detected third backscattered light, wherein a time between the receiving of the first signal and the receiving of the third signal is less than 67 ms.

8. The method of claim 1, wherein processing the image of the user interaction comprises scaling an area of the image by one-fourth.

9. The method of claim 1, wherein the light source and the detector are located on a same layer of the display.

10. The method of claim 1, further comprising:
determining a second position of the user interaction on the display;
in response to determining the second position of the user interaction: illuminating, with a second light source of the display, the second position on the display;
detecting, with a second detector of the display, a second backscattered light from the second position;
processing, based on the detected second backscattered light, the image of the user interaction; and identifying, based on the image, a second fingerprint of the user interaction, wherein:
the first position corresponds to the first fingerprint, and
the second position corresponds to the second fingerprint.

11. The method of claim 1, wherein the light source is located within a distance less than three times a thickness of a cover glass of the display from the detector.

12. The method of claim 1, wherein:
the display comprises a plurality of light sources,
the detector is located within a range of the backscattered light,
the plurality of light sources includes the first light source and a second light source, the second light source located within the range of the backscattered light, and
the method further comprises:
in response to illuminating the position on the display with the first light source, forgoing illuminating with the second light source.

13. An electronic device, comprising:
a processor;
a memory;
a display comprising a light source and a detector, wherein the electronic device displays content on the display by illuminating the display with the light source; and
a program stored in the memory, configured to be executed by the processor, and including instructions for performing a method comprising:
detecting, with the display, a user interaction with the display;
determining a position of the user interaction on the display;
in response to determining the position of the user interaction: illuminating, with the light source, the position on the display;
detecting, with the detector, a backscattered light from the position;
processing, based on the detected backscattered light, an image of the user interaction; and
identifying, based on the image, a fingerprint of the user interaction
wherein:
the display comprises a plurality of light sources and detectors,
the light sources and the detectors have same pitch widths,
the plurality of light sources includes the light source,
the plurality of detectors includes the detector, and
the light source is located at a half pitch width from the detector.

14. A method, comprising:
at an electronic device comprising a display, the display comprising a light source and a detector, wherein the electronic device displays content on the display by illuminating the display with the light source:
detecting, with the display, a user interaction with the display;
determining a position of the user interaction on the display;
in response to determining the position of the user interaction: illuminating, with the light source, the position on the display;
detecting, with the detector, a backscattered light from the position;
processing, based on the detected backscattered light, an image of the user interaction; and
identifying, based on the image, a fingerprint of the user interaction, wherein:
the electronic device comprises a readout circuit and a multiplexer comprising a first column input and a second column input, and
the multiplexer is electrically coupled to the readout circuit, the method further comprising:
receiving, at the first column input, a first signal associated with the detected first backscattered light; and
receiving, at the second column input, a second signal associated with a detected second backscattered light.

* * * * *